(12) United States Patent
Wang et al.

(10) Patent No.: US 12,557,497 B2
(45) Date of Patent: Feb. 17, 2026

(54) DISPLAY PANEL AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Xinxin Wang, Beijing (CN); Bo Zhang, Beijing (CN); Zhiwen Chu, Beijing (CN); Yi Qu, Beijing (CN); Aoyuan Feng, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 480 days.

(21) Appl. No.: 18/016,680

(22) PCT Filed: Jan. 30, 2022

(86) PCT No.: PCT/CN2022/075159
§ 371 (c)(1),
(2) Date: Jan. 18, 2023

(87) PCT Pub. No.: WO2023/142100
PCT Pub. Date: Aug. 3, 2023

(65) Prior Publication Data
US 2024/0244903 A1 Jul. 18, 2024

(51) Int. Cl.
*H10K 59/131* (2023.01)
*H10K 59/124* (2023.01)

(52) U.S. Cl.
CPC ......... *H10K 59/131* (2023.02); *H10K 59/124* (2023.02)

(58) Field of Classification Search
CPC ..... H10K 59/124; H10K 59/131; H10K 59/00
See application file for complete search history.

(56) References Cited

U.S. PATENT DOCUMENTS

| 10,739,889 B2 | 8/2020 | Hwang et al. |
| 2016/0064691 A1 | 3/2016 | Lee et al. |
| (Continued) | | |

FOREIGN PATENT DOCUMENTS

| CN | 105390525 A | 3/2016 |
| CN | 209150099 U | 7/2019 |
| (Continued) | | |

*Primary Examiner* — Vongsavanh Sengdara
(74) *Attorney, Agent, or Firm* — Ling Wu; Stephen Yang; Ling and Yang Intellectual Property

(57) ABSTRACT

The present disclosure provides a display panel and a display apparatus. The display panel includes multiple signal leads located on the base substrate and at least located in the first fanout region; the first fanout region includes at least one fanout edge region, the fanout edge region includes an organic layer covered region and an organic layer uncovered region, an orthographic projection of the first organic composite insulation layer on the base substrate is located in the organic layer covered region, the orthographic projection of the first organic composite insulation layer on the base substrate is not overlapped with the organic layer uncovered region, the second inorganic insulation layer covers the organic layer uncovered region, and an orthographic projection of the second inorganic insulation layer on the base substrate is at least partially overlapped with the orthographic projection of the first organic composite insulation layer on the base substrate.

20 Claims, 5 Drawing Sheets

(56) References Cited

U.S. PATENT DOCUMENTS

| | | | |
|---|---|---|---|
| 2017/0288008 A1* | 10/2017 | Kim | H10K 59/1315 |
| 2019/0019966 A1 | 1/2019 | Jiang et al. | |
| 2020/0175917 A1* | 6/2020 | Jo | H10K 59/1315 |
| 2020/0176540 A1* | 6/2020 | Park | H10D 86/60 |
| 2020/0388665 A1* | 12/2020 | Jung | H10K 59/131 |
| 2021/0020724 A1* | 1/2021 | Cho | H10K 59/131 |
| 2021/0118343 A1* | 4/2021 | Im | H05K 1/028 |
| 2021/0257589 A1 | 8/2021 | Wang et al. | |
| 2021/0376039 A1* | 12/2021 | Jo | H10K 77/111 |
| 2022/0020827 A1* | 1/2022 | Liu | H10K 59/80516 |
| 2022/0077111 A1* | 3/2022 | Shin | H10K 59/131 |
| 2022/0093540 A1* | 3/2022 | Zhang | H10D 86/443 |
| 2022/0100302 A1 | 3/2022 | Li et al. | |
| 2022/0276735 A1 | 9/2022 | Pu et al. | |
| 2023/0040064 A1 | 2/2023 | Ltd et al. | |

FOREIGN PATENT DOCUMENTS

| | | |
|---|---|---|
| CN | 111477666 A | 7/2020 |
| CN | 112071893 A | 12/2020 |
| CN | 112133729 A | 12/2020 |
| CN | 112420788 A | 2/2021 |
| CN | 112820766 A | 5/2021 |
| CN | 113314582 A | 8/2021 |
| CN | 113937236 A | 1/2022 |

\* cited by examiner

DISPLAY PANEL AND DISPLAY APPARATUS

CROSS-REFERENCE TO RELATED APPLICATION

The present application is a U.S. National Phase Entry of International PCT Application No. PCT/CN2022/075159, having an international filing date of Jan. 30, 2022, the entire content of which is hereby incorporated by reference.

TECHNICAL FIELD

The present disclosure relates to, but is not limited to, the field of display technologies, in particular to a display panel and a display apparatus.

BACKGROUND

With rapid development of display technologies, touch screens have been gradually widespread in people's daily life. According to composition structures, types of touch screens may be divided into Add on Mode type, On Cell type, In Cell type, and so on. According to working principles thereof, types of touch screens may be divided into capacitive type, resistive type, infrared type, surface acoustic wave type, and so on. Capacitive On Cell type is a touch control structure formed on a light exit surface of a display screen, and the Capacitive On Cell type has gradually became a mainstream technology due to advantages such as simple structure, small thickness, high transmittance, etc.

As an active light emitting display device, an Organic Light Emitting Diode (OLED) has advantages of self-illumination, wide viewing angle, high contrast ratio, low power consumption, extremely high response speed, etc. With constant development of display technologies, a flexible display apparatus (Flexible Display) using an OLED as a light emitting device and performing signal control using a Thin Film Transistor (TFT for short) has become a mainstream product in the field of display at present. According to product requirements such as flexible folding and a narrow bezel, an existing touch control structure based on an OLED adopts a structural form of Flexible Multi-Layer On Cell (FMLOC). A flexible touch substrate is provided on an encapsulation layer of an OLED backplane and has advantages of thinness and foldability, which may meet the product requirements of flexible folding and narrow bezel, etc.

SUMMARY

The following is a summary of subject matters described herein in detail. The summary is not intended to limit the protection scope of claims.

In a first aspect, an implementation of the present disclosure provides a display panel, including: a base substrate, wherein the base substrate includes a display region and a peripheral region at least partially surrounding the display region, the peripheral region includes a bonding region located on a side of the display region, the bonding region includes a first fanout region and a bending region, and the bending region is located on a side of the first fanout region away from the display region; multiple signal leads, located on the base substrate and at least located in the first fanout region; a first inorganic insulation layer, located on a side of the multiple signal leads away from the base substrate; a first organic composite insulation layer, located on a side of the first inorganic insulation layer away from the base substrate; a second inorganic insulation layer, located at least on a side of the first organic composite insulation layer away from the base substrate; a first power supply line, located in the peripheral region and at least partially surrounding the display region; a first power supply pin terminal and a second power supply pin terminal, located in the bonding region and respectively connected with both ends of the first power supply line; the first fanout region includes at least one fanout edge region, the at least one fanout edge region is located on a side of one of the first power supply pin terminal and the second power supply pin terminal away from the other, the fanout edge region includes an organic layer covered region and an organic layer uncovered region, an orthographic projection of the first organic composite insulation layer on the base substrate is located in the organic layer covered region, the orthographic projection of the first organic composite insulation layer on the base substrate is not overlapped with the organic layer uncovered region, the second inorganic insulation layer covers the organic layer uncovered region, and an orthographic projection of the second inorganic insulation layer on the base substrate is at least partially overlapped with the orthographic projection of the first organic composite insulation layer on the base substrate.

In an exemplary implementation mode, the first fanout region includes a first fanout edge region and a second fanout edge region, the first fanout edge region is located on a side of the first power supply pin terminal away from the second power supply pin terminal, and the second fanout edge region is located on a side of the second power supply pin terminal away from the first power supply pin terminal.

In an exemplary implementation mode, the second inorganic insulation layer includes a first edge extending along a first direction and a second edge extending along a second direction, and the first direction and the second direction intersect; an orthographic projection of at least one of the first edge and the second edge on the base substrate is overlapped with an orthographic projection of the first organic composite insulation layer on the base substrate.

In an exemplary implementation mode, orthographic projections of the first edge and the second edge on the base substrate are all overlapped with an orthographic projection of the first organic composite insulation layer on the base substrate.

In an exemplary implementation mode, the first organic composite insulation layer includes a third edge extending along the first direction and a fourth edge extending along the second direction, a minimum distance between an orthographic projection of the second edge on the base substrate and an orthographic projection of the fourth edge on the base substrate is L1, and the L1 is greater than or equal to 40 um and less than or equal to 200 um.

In an exemplary implementation mode, the first organic composite insulation layer includes a third edge extending along the first direction and a fourth edge extending along the second direction, and a minimum distance between an orthographic projection of the first edge on the base substrate and an orthographic projection of the third edge on the base substrate is greater than or equal to 40 um and less than or equal to 200 um.

In an exemplary implementation mode, the first organic composite insulation layer includes a first organic insulation layer, a second organic insulation layer, and a third organic insulation layer disposed in sequence along a direction away from the base substrate, the first organic insulation layer, the second organic insulation layer, and the third organic insulation layer each include the third edge and the fourth edge, a minimum distance between an orthographic projection of the second edge on the base substrate and an orthographic projection of the fourth edge of the first organic insulation layer on the base substrate is L2, and the L2 is greater than or equal to 20 um and less than or equal to 180 um.

In an exemplary implementation mode, a minimum distance between an orthographic projection of the second edge 502 on the base substrate and an orthographic projection of the fourth edge of the second organic insulation layer on the base substrate is L3, and the L3 is greater than or equal to 30 um and less than or equal to 190 um.

In an exemplary implementation mode, a minimum distance between an orthographic projection of the fourth edge of the first organic insulation layer on the base substrate and an orthographic projection of the fourth edge of the second organic insulation layer on the base substrate is L4, a minimum distance between the orthographic projection of the fourth edge of the second organic insulation layer on the base substrate and an orthographic projection of the fourth edge of the third organic insulation layer on the base substrate is L5, and a ratio of L4 to L5 is 1 to 2.

In an exemplary implementation mode, a drive structure layer located on the display region, a light emitting structure layer located on the drive structure layer, and a touch control structure layer located on the light emitting structure layer are also included.

In an exemplary implementation mode, the drive structure layer includes: a first insulation layer disposed on the base substrate, an active layer disposed on the first insulation layer, a second insulation layer covering the active layer, a first gate metal layer disposed on the second insulation layer, a third insulation layer covering the first gate metal layer, a second gate metal layer disposed on the third insulation layer, a fourth insulation layer covering the second gate metal layer, a first source-drain metal layer disposed on the fourth insulation layer, and a fifth insulation layer covering the first source-drain metal layer, the first gate metal layer at least includes a gate electrode and a first capacitor electrode, the second gate metal layer at least includes a second capacitor electrode, the first source-drain metal layer at least includes a source electrode and a drain electrode, the first capacitor electrode and the second capacitor electrode constitute a storage capacitor, and the fifth insulation layer and the first inorganic insulation layer are located in a same layer and have a same material.

In an exemplary implementation mode, the multiple signal leads are located in the first gate metal layer and the second gate metal layer, respectively.

In an exemplary implementation mode, the multiple signal leads includes multiple first leads and multiple second leads located on a side of the multiple first leads away from the base substrate, the multiple first leads and the multiple second leads are electrically connected, the third insulation layer is located between the multiple first leads and the multiple second leads, the multiple first leads are respectively located in the first gate metal layer, and the multiple second leads are respectively located in the second gate metal layer.

In an exemplary implementation mode, the multiple signal leads are respectively located in the first gate metal layer.

In an exemplary implementation mode, the multiple signal leads are respectively located in the second gate metal layer.

In an exemplary implementation mode, further including a first planarization layer disposed on the drive structure layer, a second source-drain metal layer disposed on the first planarization layer, a second planarization layer covering the second source-drain metal layer, a pixel definition layer disposed on the second planarization layer, the first organic composite insulation layer includes a first organic insulation layer, a second organic insulation layer, and a third organic insulation layer disposed in sequence along a direction away from the base substrate, the first planarization layer and the first organic insulation layer are located in a same layer and have a same material, the second planarization layer and the second organic insulation layer are located in a same layer and have a same material, and the pixel definition layer and the third organic insulation layer are located in a same layer and have a same material.

In an exemplary implementation mode, the touch control structure layer includes a bridge electrode layer, a seventh insulation layer, and a touch control electrode layer disposed in sequence on a side of the light emitting structure layer away from the base substrate, and the seventh insulation layer and the second inorganic insulation layer are located in a same layer and have a same material.

In an exemplary implementation mode, at least one first groove is disposed in the first organic composite insulation layer, and the at least one first groove is located between the display region and the bending region.

In an exemplary implementation mode, the bonding region further includes a second fanout region, the second fanout region is located on a side of the bending region away from the display region, a second organic composite insulation layer is disposed on the second fanout region, at least one second groove is disposed in the second organic composite insulation layer, and the at least one second groove is located on a side of the bending region away from the display region.

In an exemplary implementation mode, an orthographic projection of the second inorganic insulation layer on the base substrate is not overlapped with the bending region.

In an exemplary implementation mode, the multiple signal lines are at least one of a clock signal line, an initialization line, a high-level signal line, and a low-level signal line.

In another aspect, an implementation of the present disclosure also provides a display apparatus, including the aforementioned display panel.

Other aspects may be comprehended upon reading and understanding drawings and detailed descriptions.

BRIEF DESCRIPTION OF DRAWINGS

Accompanying drawings are used for providing further understanding of technical solutions of the present disclosure, constitute a part of the specification, and together with the implementations of the present disclosure, are used for explaining the technical solutions of the present disclosure but not to constitute limitations on the technical solutions of the present disclosure. Shapes and sizes of various components in the drawings do not reflect actual scales, but are only intended to schematically illustrate contents of the present disclosure.

DETAILED DESCRIPTION

Figure 1:
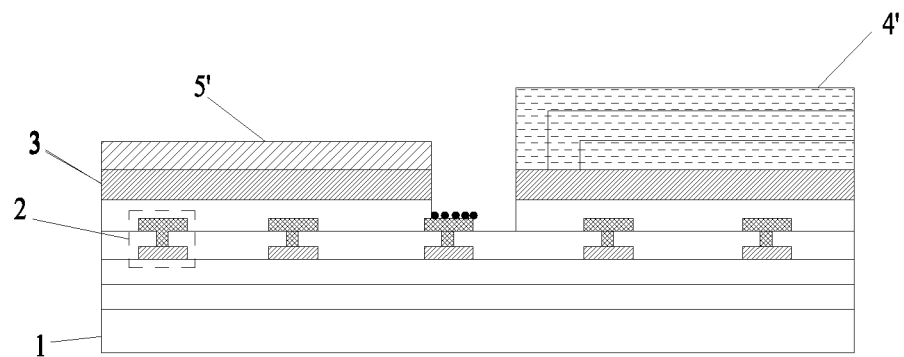
FIG. 1 is a sectional view of a first fanout region in a display panel of a related art.

To make objectives, technical solutions, and advantages of the present disclosure clearer, the implementations of the present disclosure will be described in detail with reference to the accompanying drawings. It is to be noted that implementation modes may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementation modes only. The implementations in the present disclosure and features in the implementations may be combined randomly with each other without conflict.

In the drawings, a size of each constituent element, a thickness of a layer, or a region is exaggerated sometimes for clarity. Therefore, one implementation mode of the present disclosure is not necessarily limited to the sizes, and shapes and sizes of various components in the drawings do not reflect actual scales. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

In the present disclosure, "about" refers to that a boundary is defined not so strictly and numerical values within process and measurement error ranges are allowed.

FIG. 1 is a sectional view of a first fanout region in a display panel of a related art. The display panel of the related art includes a display region and a non-display region located at a periphery of the display region. The non-display region includes a bonding region located on one side of the display region and an edge region located on the other side of the display region.

The bonding region includes a first fanout region and a bending region disposed in sequence along a direction away from the display region. In a direction perpendicular to a plane where the display panel is located, the display region includes a drive structure layer, a light emitting structure layer disposed on the drive structure layer, and a touch control structure layer disposed on the light emitting structure layer. The touch control structure layer includes a touch control unit and an inorganic insulation layer (TLD) disposed on the touch control unit. The inorganic insulation layer covers the touch control unit and is used for encapsulating the touch control unit. As shown in FIG. 1, an inorganic insulation layer 5' extends to the first fanout region of the bonding region. Since the inorganic insulation layer 5' has relatively high hardness, in order to make the bending region in the bonding region easier to be bent, the inorganic insulation layer 5' on the bending region and a part of the inorganic insulation layer 5' on a side of the first fanout region close to the bending region need to be etched and removed. However, in a process of etching the inorganic insulation layer 5', besides etching off a film layer of the inorganic insulation layer 5' itself on the first fanout region, the inorganic insulation layer 5' will continue to be etched down to a certain depth, that is, over-etching. Since a part of a region of the first fanout region is not covered with an organic insulation composite layer 4', in a region where the organic insulation layer is not covered in the first fanout region, a first inorganic insulation layer 3 of a previous process on the first fanout region will be etched off together with the inorganic insulation layer 5', so that multiple signal leads 2 in a region where the organic insulation layer is not covered in the first fanout region are exposed and easily corroded by water, oxygen, and the like.

The present disclosure provides a first aspect, and an implementation of the present disclosure provides a display method, including: a base substrate, wherein the base substrate includes a display region and a peripheral region at least partially surrounding the display region, the peripheral region includes a bonding region located on a side of the display region, the bonding region includes a first fanout region and a bending region, and the bending region is located on a side of the first fanout region away from the display region; multiple signal leads, located on the base substrate and at least located in the first fanout region; a first inorganic insulation layer, located on a side of the multiple signal leads away from the base substrate; a first organic composite insulation layer, located on a side of the first inorganic insulation layer away from the base substrate; a second inorganic insulation layer, located at least on a side of the first organic composite insulation layer away from the base substrate; a first power supply line, located in the peripheral region and at least partially surrounding the display region; a first power supply pin terminal and a second power supply pin terminal, located in the bonding region and respectively connected with both ends of the first power supply line; the first fanout region includes at least one fanout edge region, the at least one fanout edge region is located on a side of one of the first power supply pin terminal and the second power supply pin terminal away from the other, the fanout edge region includes an organic layer covered region and an organic layer uncovered region, an orthographic projection of the first organic composite insulation layer on the base substrate is located in the organic layer covered region, the orthographic projection of the first organic composite insulation layer on the base substrate is not overlapped with the organic layer uncovered region, the second inorganic insulation layer covers the organic layer uncovered region, and an orthographic projection of the second inorganic insulation layer on the base substrate is at least partially overlapped with the orthographic projection of the first organic composite insulation layer on the base substrate.

In an exemplary implementation mode, the first fanout region includes a first fanout edge region and a second fanout edge region, wherein the first fanout edge region is located on a side of the first power supply pin terminal away from the second power supply pin terminal, and the second fanout edge region is located on a side of the second power supply pin terminal away from the first power supply pin terminal.

In an exemplary implementation mode, the second inorganic insulation layer includes a first edge extending along a first direction and a second edge extending along a second direction, and the first direction and the second direction intersect; an orthographic projection of at least one of the first edge and the second edge on the base substrate is overlapped with an orthographic projection of the first organic composite insulation layer on the base substrate.

In an exemplary implementation mode, orthographic projections of the first edge and the second edge on the base substrate are all overlapped with an orthographic projection of the first organic composite insulation layer on the base substrate.

In an exemplary implementation mode, the first organic composite insulation layer includes a third edge extending along the first direction and a fourth edge extending along the second direction, a minimum distance between an orthographic projection of the second edge on the base substrate and an orthographic projection of the fourth edge on the base substrate is L1, and the L1 is greater than or equal to 40 um and less than or equal to 200 um.

In an exemplary implementation mode, the first organic composite insulation layer includes a third edge extending along the first direction and a fourth edge extending along the second direction, and a minimum distance between an orthographic projection of the first edge on the base substrate and an orthographic projection of the third edge on the base substrate is greater than or equal to 40 um and less than or equal to 200 um.

In an exemplary implementation mode, the first organic composite insulation layer includes a first organic insulation layer, a second organic insulation layer, and a third organic insulation layer disposed in sequence along a direction away from the base substrate, the first organic insulation layer, the second organic insulation layer, and the third organic insulation layer each include the third edge and the fourth edge, a minimum distance between an orthographic projection of the second edge on the base substrate and an orthographic projection of the fourth edge of the first organic insulation layer on the base substrate is L2, and the L2 is greater than or equal to 20 um and less than or equal to 180 um.

In an exemplary implementation mode, a minimum distance between an orthographic projection of a second edge 502 on the base substrate and an orthographic projection of the fourth edge of the second organic insulation layer on the base substrate is L3, and the L3 is greater than or equal to 30 um and less than or equal to 190 um.

In an exemplary implementation mode, a minimum distance between an orthographic projection of the fourth edge of the first organic insulation layer on the base substrate and an orthographic projection of the fourth edge of the second organic insulation layer on the base substrate is L4, a minimum distance between the orthographic projection of the fourth edge of the second organic insulation layer on the base substrate and an orthographic projection of the fourth edge of the third organic insulation layer on the base substrate is L5, and a ratio of L4 to L5 is 1 to 2.

In an exemplary implementation mode, a drive structure layer located on the display region, a light emitting structure layer located on the drive structure layer, and a touch control structure layer located on the light emitting structure layer are also included.

In an exemplary implementation mode, the drive structure layer includes: a first insulation layer disposed on the base substrate, an active layer disposed on the first insulation layer, a second insulation layer covering the active layer, a first gate metal layer disposed on the second insulation layer, a third insulation layer covering the first gate metal layer, a second gate metal layer disposed on the third insulation layer, a fourth insulation layer covering the second gate metal layer, a first source-drain metal layer disposed on the fourth insulation layer, and a fifth insulation layer covering the first source-drain metal layer, the first gate metal layer at least includes a gate electrode and a first capacitor electrode, the second gate metal layer at least includes a second capacitor electrode, the first source-drain metal layer at least includes a source electrode and a drain electrode, the first capacitor electrode and the second capacitor electrode constitute a storage capacitor, and the fifth insulation layer and the first inorganic insulation layer are located in a same layer and have a same material.

In an exemplary implementation mode, the multiple signal leads are located in the first gate metal layer and the second gate metal layer, respectively.

In an exemplary implementation mode, the multiple signal leads includes multiple first leads and multiple second leads located on a side of the multiple first leads away from the base substrate, the multiple first leads and the multiple second leads are electrically connected, the third insulation layer is located between the multiple first leads and the multiple second leads, the multiple first leads are respectively located in the first gate metal layer, and the multiple second leads are respectively located in the second gate metal layer.

In an exemplary implementation mode, the multiple signal leads are respectively located in the first gate metal layer.

In an exemplary implementation mode, the multiple signal leads are respectively located in the second gate metal layer.

In an exemplary implementation mode, further including a first planarization layer disposed on the drive structure layer, a second source-drain metal layer disposed on the first planarization layer, a second planarization layer covering the second source-drain metal layer, a pixel definition layer disposed on the second planarization layer, the first organic composite insulation layer includes a first organic insulation layer, a second organic insulation layer, and a third organic insulation layer disposed in sequence along a direction away from the base substrate, the first planarization layer and the first organic insulation layer are located in a same layer and have a same material, the second planarization layer and the second organic insulation layer are located in a same layer and have a same material, and the pixel definition layer and the third organic insulation layer are located in a same layer and have a same material.

In an exemplary implementation mode, the touch control structure layer includes a bridge electrode layer, a seventh insulation layer, and a touch control electrode layer disposed in sequence on a side of the light emitting structure layer away from the base substrate, and the seventh insulation layer and the second inorganic insulation layer are located in a same layer and have a same material.

In an exemplary implementation mode, at least one first groove is disposed in the first organic composite insulation layer, and the at least one first groove is located between the display region and the bending region.

In an exemplary implementation mode, the bonding region further includes a second fanout region, the second fanout region is located on a side of the bending region away from the display region, a second organic composite insulation layer is disposed on the second fanout region, at least one second groove is disposed in the second organic composite insulation layer, and the at least one second groove is located on a side of the bending region away from the display region.

In an exemplary implementation mode, an orthographic projection of the second inorganic insulation layer on the base substrate is not overlapped with the bending region.

In an exemplary implementation mode, the multiple signal lines are at least one of a clock signal line, an initialization line, a high-level signal line, and a low-level signal line.

In another aspect, an implementation of the present disclosure also provides a display apparatus, including the aforementioned display panel.

Figure 2:
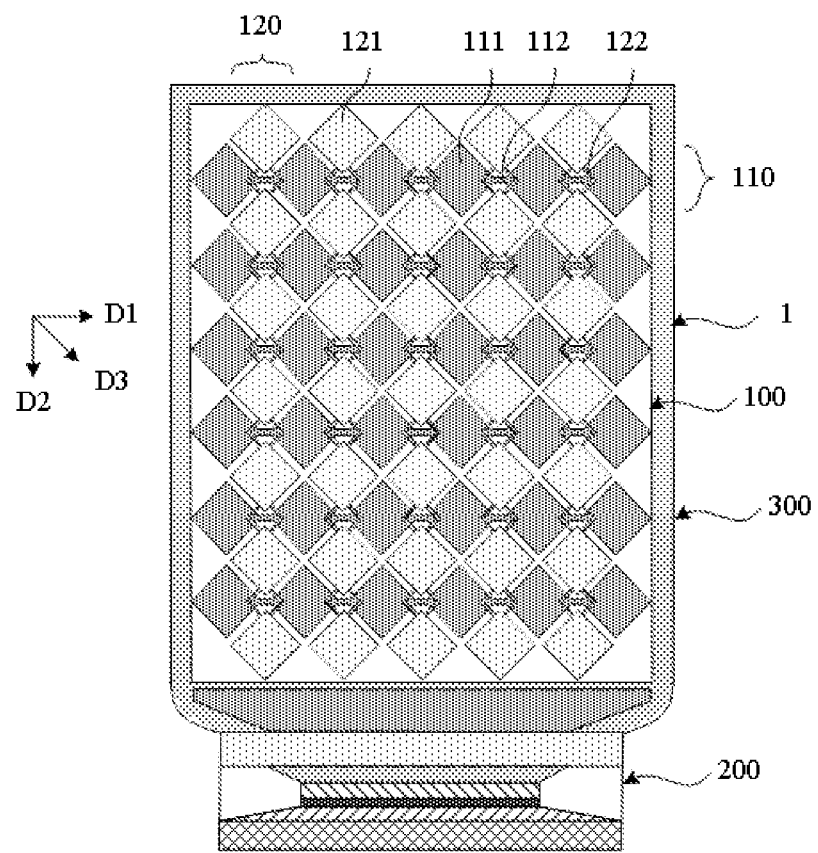
FIG. 2 is a schematic diagram of a structure of a display panel of the present disclosure.

FIG. 2 is a schematic diagram of a structure of a display panel of the present disclosure. As shown in FIG. 2, the display panel of the present disclosure includes a base substrate 1, the base substrate includes a display region 100 and a non-display region located at a periphery of the display region 100. The non-display region includes a bonding region 200 located on one side of the display region 100 and an edge region 300 located on other sides of the display region 100.

In an exemplary implementation mode, the display panel of the present disclosure further includes a drive structure layer, a light emitting structure layer, and a touch control structure layer, and the drive structure layer is located on the base substrate 1 and located in the display region 100. The light emitting structure layer is located on a side of the drive structure layer away from the base substrate 1 and located in the display region 100. The touch control structure layer is located on a side of the light emitting structure layer away from the base substrate 1 and located in the display region 100. The light emitting structure layer at least includes multiple light emitting units arranged regularly, the bonding region 200 is at least provided with a bonding circuit for connecting signal lines of the multiple light emitting units to an external drive apparatus, and the edge region 300 is at least provided with a power supply line for transmitting voltage signals to the multiple light emitting units. The bonding region 200 and the edge region 300 form an annular structure surrounding the display region 100.

In an exemplary implementation mode, perpendicular to a plane where the display panel is located, the drive structure layer mainly includes a pixel drive circuit composed of multiple Thin Film Transistors (TFTs), and each light emitting unit mainly includes an anode, an organic emitting layer, and a cathode that are stacked. The touch control structure layer mainly includes multiple touch control units.

Figure 3:
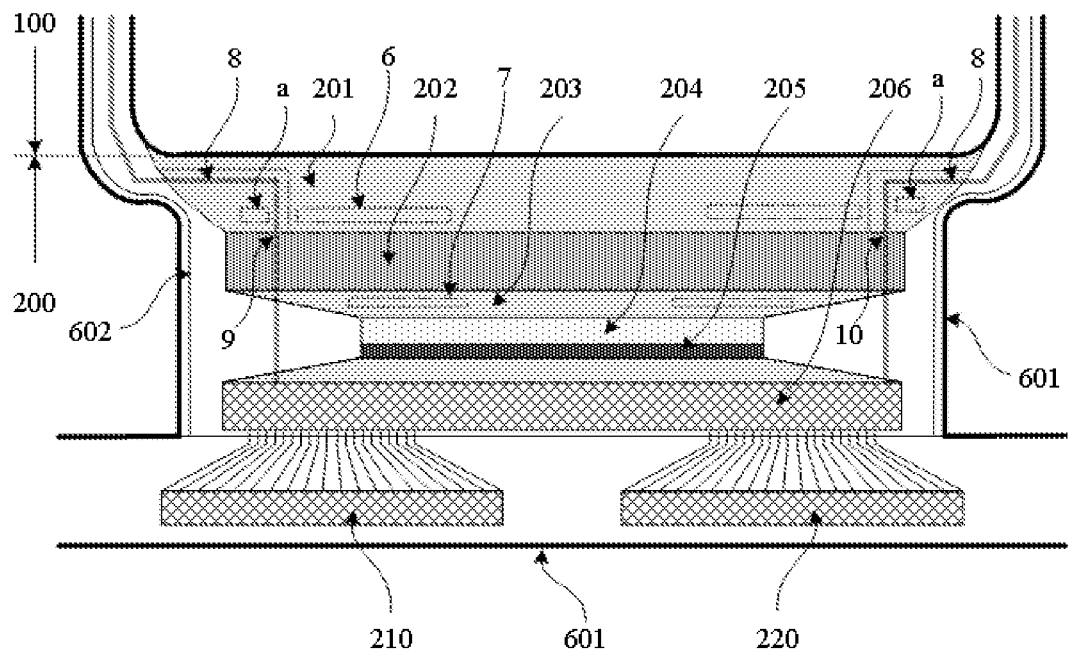
FIG. 3 is a schematic diagram of a structure of a bonding region in the display panel of the present disclosure.

FIG. 3 is a schematic diagram of a structure of a bonding region in the display panel of the present disclosure. As shown in FIG. 3, in a plane parallel to the display panel, the bonding region 200 of the display panel of the implementation of the present disclosure is located on a side of the display region 100, and the bonding region 200 includes a first fanout region 201, a bending region 202, a second fanout region 203, an anti-static region 204, a drive chip region 205, and a bonding electrode region 206 which are sequentially disposed along a direction away from the display region 100. The bending region 202 is configured to make the second fanout region 203, the anti-static region 204, the driving chip region 205, and a bonding pin region 206 be bent to a back surface of the display region 100. The second fanout region 203 includes multiple data connection lines led out in a fanout trace manner. The anti-static region 204 includes an anti-static circuit configured to prevent electrostatic damage to the display panel by eliminating static electricity. The drive chip region 205 includes an Integrated Circuit (IC) configured to be connected with multiple data connection lines. The bonding electrode region 206 includes multiple Bonding Pads configured to be bonded and connected with an external Flexible Printed Circuit (FPC).

In an exemplary implementation mode, in a process of preparing the display apparatus, a first array test unit 210 and a second array test unit 220 are disposed on a side of the bonding region 200 away from the display region 100, and each of the first array test unit 210 and the second array test unit 220 includes multiple test terminals (ET Pads) which are correspondingly connected with multiple pins of the bonding pin region 206 through interface lines and are configured to test the display panel to check whether there is a problem such as short circuit and open circuit.

In an exemplary implementation mode, a first cutting line 601 and a second cutting line 602 are disposed outside the bonding region 200. The first cutting line 601 is located on a side of the second cutting line 602 away from the bonding region 200. The first cutting line 601 and the second cutting line 602 each extend around an edge of the bonding region 200, and shapes of the first cutting line 601 and the second cutting line 602 are all the same as a contour of the bonding region 200. The first cutting line 601 is a coarse cutting line and the second cutting line 602 is a fine cutting line.

In an exemplary implementation mode, the second cutting line 602 is disposed between the bonding region 200 and the first array test unit 210 and the second array test unit 220. At least one first cutting line 601 is disposed on a side of the first array test unit 210 and the second array test unit 220 away from the bonding region 200. After a film layer process is completed, a cutting device cuts along the first cutting line 601 (coarse cutting line), and after a test is completed, the cutting device cuts along the second cutting line 602 (fine cutting line), separating both the first array test unit 210 and the second array test unit 220 from the bonding region 200 to form the display panel.

Figure 4A:
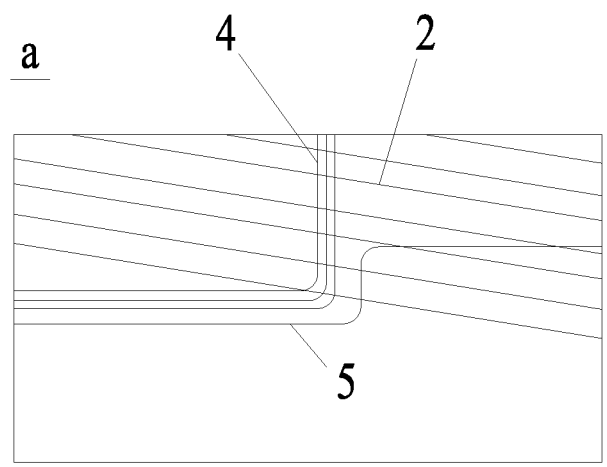
FIG. 4a is a first partial enlarged view of a fanout edge region in the display panel of the present disclosure.
Figure 4B:
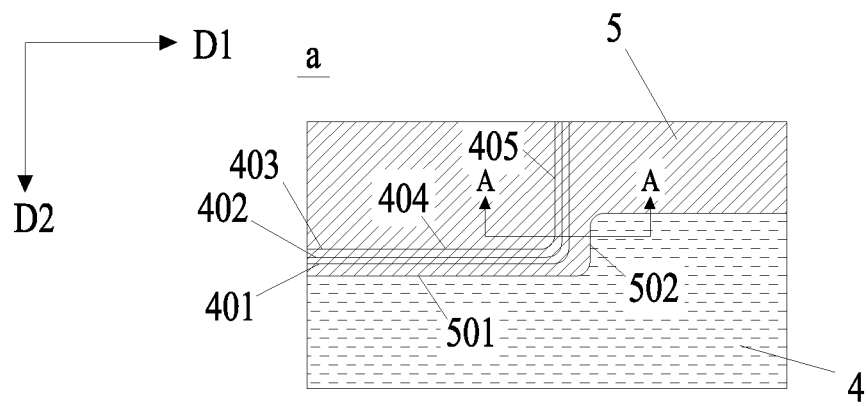
FIG. 4b is a second partial enlarged view of the fanout edge region in the display panel of the present disclosure.
Figure 5A:
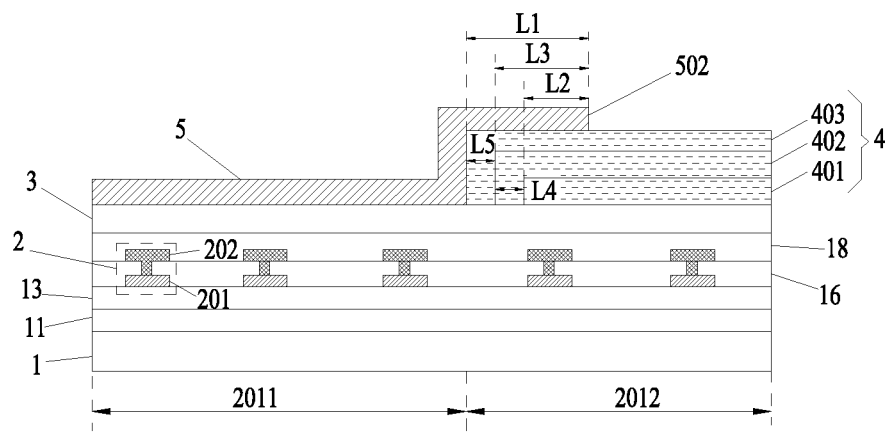
FIG. 5a is a first partial sectional view of a first fanout region in the display panel of the present disclosure.

FIG. 4a is a first partial enlarged view of a fanout edge region in the display panel of the present disclosure; FIG. 4b is a second partial enlarged view of the fanout edge region in the display panel of the present disclosure; FIG. 5a is a first partial sectional view of a first fanout region in the display panel of the present disclosure. FIG. 4a and FIG. 4b are both enlarged views at a in FIG. 3, and FIG. 5a is a sectional view at A-A in FIG. 4b. As shown in FIG. 3, FIG. 4a, FIG. 4b, and FIG. 5a, the display panel of the implementation of the present disclosure further includes a data fanout line, multiple signal leads 2, a first power supply line 8, a second power supply line, a first inorganic insulation layer 3, a first organic composite insulation layer 4, and a second inorganic insulation layer 5.

In an exemplary implementation mode, as shown in FIG. 3, on a plane parallel to where the display panel is located, the data fanout line, the first power supply line 8, the second power supply line (not shown), and the multiple signal leads are all located on the base substrate 1 and at least located in the first fanout region 201. The data fanout line is located in a middle part of the first fanout region 201, and includes multiple data connection lines, the multiple data connection lines are configured to be connected with Data Lines of the display region 100 in a fanout trace manner. The first power supply line 8 is located on both sides of the data fanout line and is a low voltage power supply line (VSS). The first power supply line 8 is a lead, one end of the first power supply line 8 is connected with a first bonding electrode in the bonding electrode region 206, and the other end of the first power supply line 8 is connected with a second bonding electrode in the bonding electrode region 206 after circling the display region 100 once along an edge of the display region 100. The second power supply line is a high voltage power supply line (VDD). Multiple signal leads are respectively located on both sides of the data fanout line, and multiple signal leads are respectively located on a side of the first power supply line 8 away from the data fanout line. At least a portion of the multiple signal leads 2 extend along the edge of the display region 100, and multiple signal leads 2 are configured to connect Gate Driver on Array (GOA) leads on the edge region 300. The multiple signal leads 2 may be at least one of a clock signal line, an initialization line, a high-level signal line, and a low-level signal line.

In an exemplary implementation mode, as shown in FIGS. 4b and 5a, the first inorganic insulation layer 3 is located on the base substrate 1 and at least located on the first fanout region 201. The first inorganic insulation layer 3 is located on a side of the multiple signal leads 2 away from the base substrate 1, and at least partially covers the multiple signal leads 2, so that the multiple signal leads 2 may be prevented from being affected by water vapor adversely.

In an exemplary implementation mode, the first organic composite insulation layer 4 is located on the base substrate 1 and at least located on the first fanout region 201. The first organic composite insulation layer 4 is located on a side of the first inorganic insulation layer 3 away from the base substrate 1.

In an exemplary implementation mode, the second inorganic insulation layer 5 is located on the base substrate 1 and at least located on the first fanout region 201. The second inorganic insulation layer 5 is at least located on a side of the first organic composite insulation layer 4 away from the base substrate 1.

In an exemplary implementation mode, as shown in FIG. 3, the display panel of the implementation of the present disclosure further includes a first power supply pin terminal 9 and a second power supply pin terminal 10, both of which are located at an edge of the bonding region 202 close to the first fanout region 201, and the first power supply pin terminal 9 and the second power supply pin terminal 10 are respectively connected with both ends of the first power supply line 8. The first fanout region 201 includes at least one fanout edge region, at least one fanout edge region is located on a side of one of the first power supply pin terminal 9 and the second power supply pin terminal 10 away from the other, that is, at least one fanout edge region is located on a side of one of the first power supply pin terminal 9 and the second power supply pin terminal 10 close to an edge of the first fanout region 201.

In an exemplary implementation mode, as shown in FIG. 3, the first fanout region 201 includes a first fanout edge region and a second fanout edge region, the first fanout edge region is located on a side of the first power supply pin terminal 9 away from the second power supply pin terminal 10, and the second fanout edge region is located on a side of the second power supply pin terminal 10 away from the first power supply pin terminal 9, that is, the first fanout edge region and the second fanout edge region are respectively located in regions of edges of both sides of the first fanout region 201.

In an exemplary implementation mode, as shown in FIG. 5a, the fanout edge region includes an organic layer covered region 2012 and an organic layer uncovered region 2011, an orthographic projection of the first organic composite insulation layer 4 on the base substrate 1 is located in the organic layer covered region 2012, the orthographic projection of the first organic composite insulation layer 4 on the base substrate 1 is not overlapped with the organic layer uncovered region 2011, the first organic composite insulation layer 4 does not cover the organic layer uncovered region 2011, so that the first inorganic insulation layer 3 in the organic layer uncovered region 2011 is exposed. The second inorganic insulation layer 5 covers the organic layer uncovered region 2011, that is, at least a part of an orthographic projection of the second inorganic insulation layer 5 on the base substrate 1 is overlapped with the organic layer uncovered region 2011. The orthographic projection of the second inorganic insulation layer 5 on the base substrate 1 is at least partially overlapped with an orthographic projection of the first organic composite insulation layer 4 on the base substrate 1.

In the display panel of the implementation of the present disclosure, the orthographic projection of the second inorganic insulation layer 5 on the base substrate 1 is at least partially overlapped with the orthographic projection of the first organic composite insulation layer 4 on the base substrate 1, so that the first organic composite insulation layer 4 exists between at least a part of the second inorganic insulation layer 5 and the first inorganic insulation layer 3. The first organic composite insulation layer 4 can protect the first inorganic insulation layer 3, avoiding that the first inorganic insulation layer 3 is etched in a process of etching and removing the second inorganic insulation layer 5, so that the first inorganic insulation layer 3 can protect the multiple signal leads 2.

In an exemplary implementation mode, both the first inorganic insulation layer 3 and the third inorganic insulation layer 5 may be made of any one or more of Silicon Oxide (SiOx), Silicon Nitride (SiNx), and Silicon Oxynitride (SiON), may be a single layer, a multi-layer, or a composite layer, and have water and oxygen resistance.

In an exemplary implementation mode, as shown in FIGS. 4b and 5a, the second inorganic insulation layer 5 includes a first edge 501 extending along a first direction, and a second edge 502 extending along a second direction, and an orthographic projection of at least one of the first edge 501 and the second edge 502 on the base substrate is overlapped with an orthographic projection of the first organic composite insulation layer 4 on the base substrate. The first direction intersects with the second direction, for example, the first direction is perpendicular to the second direction.

In an exemplary implementation mode, as shown in FIGS. 4b and 5a, orthographic projections of the first edge 501 and the second edge 502 on the base substrate are both overlapped with an orthographic projection of the first organic composite insulation layer 4 on the base substrate, so that the first edge 501 and the second edge 502 of the second inorganic insulation layer 5 are both located on the first organic composite insulation layer 4.

In an exemplary implementation mode, as shown in FIGS. 4b and 5a, the first organic composite insulation layer 4 includes a third edge 404 extending along the first direction and a fourth edge 405 extending along the second direction, and a minimum distance between an orthographic projection of the second edge 502 of the second inorganic insulation layer 5 on the base substrate and an orthographic projection of the fourth edge 405 on the base substrate is L1. The L1 is greater than or equal to 40 um and less than or equal to 200 um.

In an exemplary implementation mode, as shown in FIG. 4b, a minimum distance between an orthographic projection of the first edge 501 of the second inorganic insulation layer 5 on the base substrate and an orthographic projection of the third edge 404 of the first organic composite insulation layer 4 on the base substrate is greater than or equal to 40 um and less than or equal to 200 um.

In an exemplary implementation mode, as shown in FIGS. 4b and 5a, the first organic composite insulation layer 4 includes a first organic insulation layer 401, a second organic insulation layer 402, and a third organic insulation layer 403 disposed sequentially on the first inorganic insulation layer 3 along a direction away from the base substrate 1, the first organic insulation layer 401, the second organic insulation layer 402, and the third organic insulation layer 403 each include a third edge and a fourth edge, and a minimum distance between an orthographic projection of the second edge 502 of the second inorganic insulation layer 5 on the base substrate and an orthographic projection of the fourth edge of the first organic insulation layer 401 on the base substrate is L2. The L2 is greater than or equal to 20 um and less than or equal to 180 um.

In an exemplary implementation mode, as shown in FIGS. 4b and 5a, a minimum distance between an orthographic projection of the second edge 502 of the second inorganic insulation layer 5 on the base substrate and an orthographic projection of the fourth edge of the second organic insulation layer 402 on the base substrate is L3. The L3 is greater than or equal to 30 um and less than or equal to 190 um.

In an exemplary implementation mode, as shown in FIGS. 4b and 5a, a minimum distance between an orthographic projection of the fourth edge of the first organic insulation layer 401 and an orthographic projection of the fourth edge of the second organic insulation layer 402 on the base substrate is L4, and a minimum distance between the orthographic projection of the fourth edge of the second organic insulation layer 402 on the base substrate and an orthographic projection of the fourth edge of the third organic insulation layer 403 on the base substrate is L5. A ratio of L4 to L5 is 1 to 2. For example, the L4 and the L5 are both 10 um.

Figure 6:
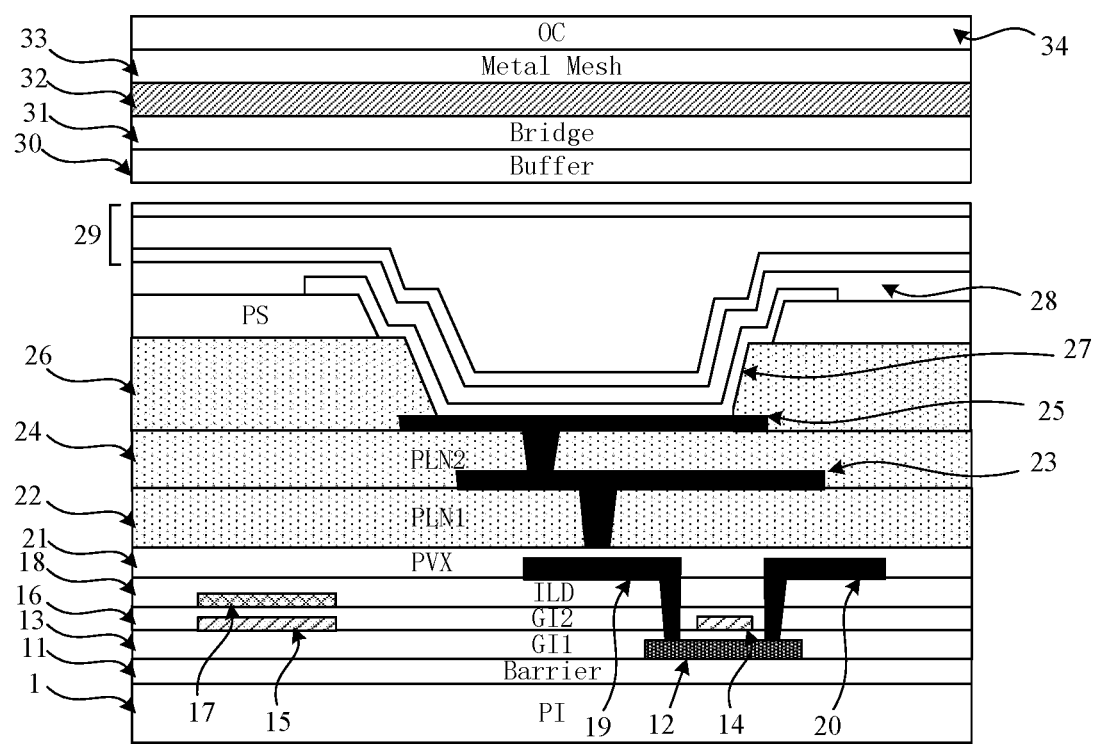
FIG. 6 is a sectional view of a display region in the display panel of the present disclosure.

FIG. 6 is a sectional view of a display region in the display panel of the present disclosure. In an exemplary implementation mode, the display panel of the present disclosure further includes a drive structure layer located on the display region, a light emitting structure layer located on the drive structure layer, and a touch control structure layer located on the light emitting structure layer. As shown in FIG. 6, perpendicular to a plane where the display panel is located, the drive structure layer includes a first insulation layer 11 disposed on the base substrate 1, an active layer 12 disposed on the first insulation layer 11, a second insulation layer 13 covering the active layer 12, a first gate metal layer disposed on the second insulation layer 13, a third insulation layer 16 covering the first gate metal layer, a second gate metal layer disposed on the third insulation layer 16, a fourth insulation layer 18 covering the second gate metal layer, a first source-drain metal layer disposed on the fourth insulation layer 18, a fifth insulation layer 21 covering the first source-drain metal layer, the first gate metal layer at least includes a gate electrode 14 and a first capacitor electrode 15, the second gate metal layer at least includes a second capacitor electrode 17, the first source-drain metal layer at least includes a source electrode 20 and a drain electrode 19, the first capacitor electrode 15 and the second capacitor electrode 17 constitute a storage capacitor, and the fifth insulation layer 21 and the first inorganic insulation layer 3 are located in a same layer and are prepared through a same patterning process using a same material. The fifth insulation layer 21 may be referred to as a Passivation (PVX) layer.

In an exemplary implementation mode, as shown in FIG. 6, perpendicular to a plane where the display panel is located, the display panel of the present disclosure further includes a first planarization layer 22 disposed on the drive structure layer, a second source-drain metal layer 23 disposed on the first planarization layer 22, a second planarization layer 24 covering the second source-drain metal layer 23, a pixel definition layer 26 disposed on the second planarization layer 24, the first planarization layer 22 and the first organic insulation layer 401 are located in a same layer and prepared through a same patterning process using a same material; the second planarization layer 24 and the second organic insulation layer 402 are located in a same layer and prepared through a same patterning process using a same material; the pixel definition layer 26 and the third organic insulation layer 403 are located in a same layer and prepared through a same patterning process using a same material.

In an exemplary implementation mode, as shown in FIG. 6, perpendicular to a plane where the display panel is located, multiple light emitting units in the light emitting structure layer each includes an anode 25 disposed on the second planarization layer 24, an organic emitting layer 27 disposed on the anode 25, and a cathode 28 disposed on the organic emitting layer 27, a pixel opening is disposed in the pixel definition layer 26, the pixel opening exposes the anode 25, the organic emitting layer 27 is located in the pixel opening and is electrically connected with the exposed anode 25, and the cathode 28 covers the pixel opening and is electrically connected with the organic emitting layer 27 in the pixel opening.

In an exemplary implementation mode, as shown in FIG. 6, perpendicular to a plane where the display panel is located, the display panel of the present disclosure further includes an encapsulation layer 29, and the encapsulation layer 29 covers the light emitting structure layer for protecting the light emitting structure layer. The encapsulation layer 29 may include a first inorganic encapsulation layer, an organic encapsulation layer, and a second inorganic encapsulation layer that are disposed sequentially along a direction away from the base substrate 1.

In an exemplary implementation mode, as shown in FIG. 6, perpendicular to a plane where the display panel is located, the touch control structure layer includes a buffer layer 30, a bridge electrode layer 31, a seventh insulation layer 32, a touch control electrode layer 33, and a protective layer 34 disposed in sequence on a side of the light emitting structure layer away from the base substrate 1. The seventh insulation layer 32 and the second inorganic insulation layer 5 are located in a same layer and are prepared through a same patterning process using a same material.

In an exemplary implementation mode, the multiple signal leads 2 are respectively located in the first gate metal layer and the second gate metal layer. In particular, as shown in FIG. 5a, the multiple signal leads 2 includes multiple first leads 201 and multiple second leads 202 located on a side of the multiple first leads 201 away from the base substrate 1, the multiple first leads 201 and the multiple second leads 202 are electrically connected, the third insulation layer 16 is located between the multiple first leads 201 and the multiple second leads 202, and the multiple first leads 201 are respectively located in the first gate metal layer, and the multiple first leads 201 and the gate electrode 14 and the first capacitor electrode 15 in the first gate metal layer may be located in a same layer and prepared through a same patterning process using a same material; the multiple second leads 202 are located in the second gate metal layer, and the multiple second leads 202 and the second capacitor electrode 17 in the second gate metal layer may be located in a same layer and prepared through a same patterning process using a same material.

Figure 5B:
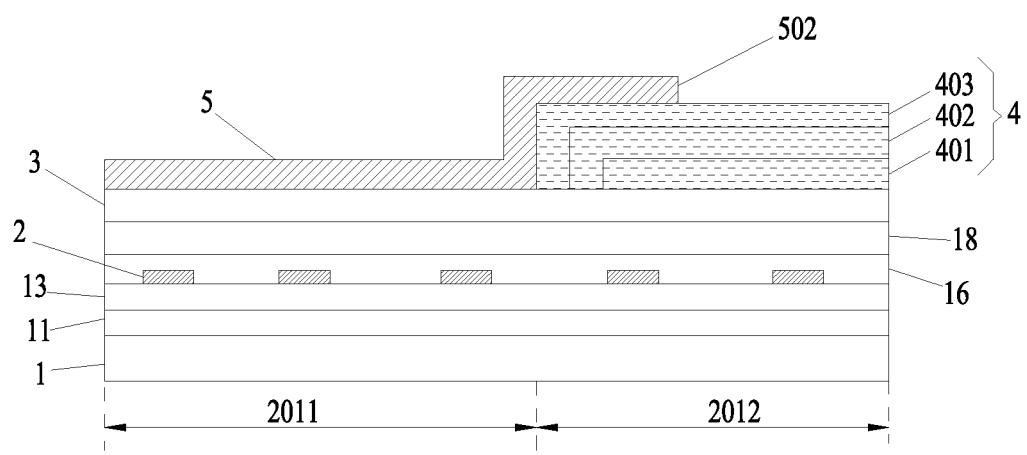
FIG. 5b is a second partial sectional view of the first fanout region in the display panel of the present disclosure.

FIG. 5b is a second partial sectional view of the first fanout region in the display panel of the present disclosure. FIG. 5b is a sectional view at A-A in FIG. 4b. In an exemplary implementation mode, as shown in FIG. 5b, multiple signal leads 2 are respectively located in the first gate metal layer, and the multiple signal leads 2 and the gate electrode 14 and the first capacitor electrode 15 in the first gate metal layer may be located in a same layer, and prepared through a same patterning process using a same material.

Figure 5C:
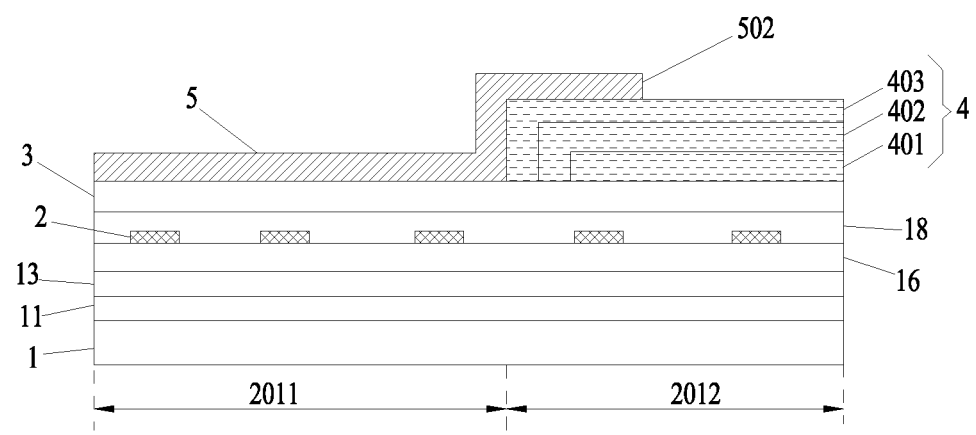
FIG. 5c is a third partial sectional view of the first fanout region in the display panel of the present disclosure.

FIG. 5c is a third partial sectional view of the first fanout region in the display panel of the present disclosure. FIG. 5c is a sectional view at A-A in FIG. 4b. In an exemplary implementation mode, as shown in FIG. 5c, multiple signal leads 2 are respectively located in the second gate metal layer, and the multiple signal leads 2 and the second capacitor electrode 17 in the second gate metal layer may be located in a same layer, and prepared through a same patterning process using a same material.

In an exemplary implementation mode, as shown in FIG. 3, in the organic layer covered region 2012 in the first fanout region 201, at least one first groove 6 is disposed in the first organic composite insulation layer 4, and the at least one first groove 6 is located between the display region 100 and the bending region 202. The first groove 6 is in a shape of a long-stripped rectangle in a direction parallel to a plane where the display panel is located. A groove bottom of the first groove 6 extends to a surface of the first inorganic insulation layer 3, that is, a region where the first groove 6 is located is a region where the first organic composite insulation layer 4 is etched and removed. The first groove 6 is configured to relieve bending stress of the bending region 202.

In an exemplary implementation mode, an orthographic projection of the second inorganic insulation layer 5 on the base substrate 1 is not overlapped with the bending region 202, that is, the second inorganic insulation layer 5 on the bending region 202 is completely etched away, thereby avoiding the second inorganic insulation layer 5 from affecting bending of the bending region 202 adversely.

In an exemplary implementation mode, the second fanout region 203 is located on a side of the bending region 202 away from the display region 100, and a second organic composite insulation layer is disposed on the second fanout region 203, the second organic composite insulation layer and the first organic composite insulation layer 4 are located in a same layer, and prepared through a same patterning process using a same material. At least one second groove 7 is disposed in the second organic composite insulation layer, and the at least one second groove 7 is located on a side of the bending region 202 away from the display region 100. The second groove 7 is in a shape of a long-stripped rectangle in a direction parallel to a plane where the display panel is located. A region where the second groove 7 is located is a region where the second organic composite insulation layer 4 is etched and removed. The second groove 7 is configured to relieve bending stress of the bending region 202.

In an exemplary implementation mode, as shown in FIG. 2, the touch control structure layer may be of a mutual capacitance structure. The touch control structure layer 100 may include multiple first touch control units 110 and multiple second touch control units 120, a first touch control unit 110 has a linear shape extending along a first direction D1 and the multiple first touch control units 110 are arranged in sequence along a second direction D2. A second touch control unit 120 has a linear shape extending along the second direction D2 and the multiple second touch control units 120 are arranged in sequence along the first direction D1. The first direction D1 intersects with the second direction D2, exemplarily, the first direction D1 is perpendicular to the second direction D2. Each first touch control unit 110 includes multiple first touch control electrodes 111 and first connection parts 112 which are arranged in sequence along the first direction D1, and the first touch control electrodes 111 and the first connection parts 112 are alternately disposed and sequentially connected through the first connection parts 112. Each second touch control unit 120 includes multiple second touch control electrodes 121 and second connection parts 122 arranged in sequence along the second direction D2, and the multiple second touch control electrodes 121 are disposed at intervals, and adjacent second touch control electrodes 121 are connected with each other through a second connection part 122.

In an exemplary implementation mode, multiple first touch control electrodes 111, multiple second touch control electrodes 121, and multiple first connection parts 112 may be located in a same layer of the touch control electrode layer 33, that is, multiple first touch control electrodes 111, multiple second touch control electrodes 121, and multiple first connection parts 112 may be formed through a same patterning process using a same material. A first touch control electrode 111 and a first connection part 112 may be connected with each other to form an integral structure. A second connection part 122 may be disposed in a bridge electrode layer and adjacent second touch control electrodes 121 are connected with each other through a via. The first touch control electrodes 111 and the second touch control electrodes 121 are alternately arranged in a third direction D3. The third direction D3 is different from both the first direction D1 and the second direction D2.

In an exemplary implementation mode, the first touch control electrodes may be drive (Tx) electrodes and the second touch control electrodes may be sensing (Rx) electrodes. Or, the first touch control electrodes may be sensing (Rx) electrodes and the second touch control electrodes may be drive (Tx) electrodes.

In an exemplary implementation mode, the first touch control electrodes 111 and the second touch control electrodes 121 may have rhombic shapes, such as regular rhombic shapes, horizontally long rhombic shapes, or vertically long rhombic shapes.

In some possible implementations, the first touch control electrodes 111 and the second touch control electrodes 121 may have any one or more of shapes of triangles, squares, trapezoids, parallelograms, pentagons, hexagons, and other polygons, which are not limited in the present disclosure.

In an exemplary implementation mode, the first touch control electrodes 111 and the second touch control electrodes 121 may be transparent conductive electrodes.

In an exemplary implementation mode, multiple drive (Tx) leads and multiple sensing (Rx) leads are disposed on the edge region 300, a first end of a drive lead is connected with a first touch control electrode 111, and a second end of the drive lead extends along the edge region 300 to the bonding region 200. A first end of a sensing lead is connected with a second touch control electrode 121, and a second end of the sensing lead extends along the edge region 300 to the bonding region 200. The drive lead and the sensing lead together form a touch control lead.

The present disclosure also provides a preparation method of a display panel, the display panel includes a base substrate, the base substrate includes a display region and a peripheral region at least partially surrounding the display region, The peripheral region includes a bonding region located on a side of the display region, the bonding region includes a first fanout region and a bending region, the bending region is located on a side of the first fanout region away from the display region, and the preparation method includes: forming multiple signal leads on the base substrate, wherein the multiple signal leads are at least located in the first fanout region; forming a first inorganic insulation layer on the multiple signal leads, wherein the first inorganic insulation layer is at least located in the first fanout region; forming a first organic composite insulation layer on the first inorganic insulation layer, wherein the first organic composite insulation layer is at least located in the first fanout region; depositing an inorganic insulation thin film covering the first organic composite insulation layer on the first inorganic insulation layer, and performing a patterning process on the inorganic insulation thin film so that the inorganic insulation thin film forms a second inorganic insulation layer; the second inorganic insulation layer is at least located in the first fanout region.

The display panel further includes a first power supply line, a first power supply pin terminal, and a second power supply pin terminal, the first power supply line is located in the peripheral region and at least partially surrounds the display region; the first power supply pin terminal and the second power supply pin terminal are located in the bonding region and are respectively connected with both ends of the first power supply line; the first fanout region includes at least one fanout edge region, the at least one fanout edge region is located on a side of one of the first power supply pin terminal and the second power supply pin terminal away from the other, the fanout edge region includes an organic layer covered region and an organic layer uncovered region, an orthographic projection of the first organic composite insulation layer on the base substrate is located in the organic layer covered region, the orthographic projection of the first organic composite insulation layer on the base substrate is not overlapped with the organic layer uncovered region, the second inorganic insulation layer covers the organic layer uncovered region, and an orthographic projection of the second inorganic insulation layer on the base substrate is at least partially overlapped with the orthographic projection of the first organic composite insulation layer on the base substrate.

The present disclosure further provides a display apparatus, including the display panel of the aforementioned implementation. The display apparatus may be any product or component with a display function, such as a mobile phone, a tablet computer, a television, a display, a laptop computer, a digital photo frame, and a navigator.

The drawings of the present disclosure only involve the structures involved in the present disclosure, and other structures may refer to conventional designs. The implementations in the present disclosure, i.e., features in the implementations, may be combined with each other to obtain new implementations if there is no conflict.

Those of ordinary skills in the art should understand that modifications or equivalent replacements may be made to the technical solutions of the present disclosure without departing from the spirit and scope of the technical solutions of the present disclosure, which shall all fall within the scope of the claims of the present application.

The invention claimed is:

1. A display panel, comprising:
a base substrate, wherein the base substrate comprises a display region and a peripheral region at least partially surrounding the display region, the peripheral region comprises a bonding region located on a side of the display region, the bonding region comprises a first fanout region and a bending region, and the bending region is located on a side of the first fanout region away from the display region;

multiple signal leads, located on the base substrate and at least located in the first fanout region;

a first inorganic insulation layer, located on a side of the multiple signal leads away from the base substrate;

a first organic composite insulation layer, located on a side of the first inorganic insulation layer away from the base substrate;

a second inorganic insulation layer, located at least on a side of the first organic composite insulation layer away from the base substrate;

a first power supply line, located in the peripheral region and at least partially surrounding the display region;

a first power supply pin terminal and a second power supply pin terminal, located in the bonding region and respectively connected with both ends of the first power supply line;

the first fanout region comprises at least one fanout edge region, the at least one fanout edge region is located on a side of one of the first power supply pin terminal and the second power supply pin terminal away from the other, the fanout edge region comprises an organic layer covered region and an organic layer uncovered region, an orthographic projection of the first organic composite insulation layer on the base substrate is located in the organic layer covered region, the orthographic projection of the first organic composite insulation layer on the base substrate is not overlapped with the organic layer uncovered region, the second inorganic insulation layer covers the organic layer uncovered region, and an orthographic projection of the second inorganic insulation layer on the base substrate is at least partially overlapped with the orthographic projection of the first organic composite insulation layer on the base substrate.

2. The display panel according to claim 1, wherein the first fanout region comprises a first fanout edge region and a second fanout edge region, the first fanout edge region is located on a side of the first power supply pin terminal away from the second power supply pin terminal, and the second fanout edge region is located on a side of the second power supply pin terminal away from the first power supply pin terminal.

3. The display panel according to claim 1, wherein the second inorganic insulation layer comprises a first edge extending along a first direction and a second edge extending along a second direction, and the first direction and the second direction intersect; an orthographic projection of at least one of the first edge and the second edge on the base substrate is overlapped with the orthographic projection of the first organic composite insulation layer on the base substrate.

4. The display panel according to claim 3, wherein orthographic projections of the first edge and the second edge on the base substrate are all overlapped with the orthographic projection of the first organic composite insulation layer on the base substrate.

5. The display panel according to claim 3, wherein the first organic composite insulation layer comprises a third edge extending along the first direction and a fourth edge extending along the second direction, a minimum distance between an orthographic projection of the second edge on the base substrate and an orthographic projection of the fourth edge on the base substrate is L1, and the L1 is greater than or equal to 40 um and less than or equal to 200 um.

6. The display panel according to claim 5, wherein the first organic composite insulation layer comprises a first organic insulation layer, a second organic insulation layer, and a third organic insulation layer disposed in sequence along a direction away from the base substrate, the first organic insulation layer, the second organic insulation layer, and the third organic insulation layer each comprise the third edge and the fourth edge, a minimum distance between an orthographic projection of the second edge on the base substrate and an orthographic projection of the fourth edge of the first organic insulation layer on the base substrate is L2, and the L2 is greater than or equal to 20 um and less than or equal to 180 um.

7. The display panel according to claim 6, wherein a minimum distance between an orthographic projection of the second edge on the base substrate and an orthographic projection of the fourth edge of the second organic insulation layer on the base substrate is L3, and the L3 is greater than or equal to 30 um and less than or equal to 190 um.

8. The display panel according to claim 6, wherein a minimum distance between an orthographic projection of the fourth edge of the first organic insulation layer on the base substrate and an orthographic projection of the fourth edge of the second organic insulation layer on the base substrate is L4, a minimum distance between the orthographic projection of the fourth edge of the second organic insulation layer on the base substrate and an orthographic projection of the fourth edge of the third organic insulation layer on the base substrate is L5, and a ratio of L4 to L5 is 1 to 2.

9. The display panel according to claim 3, wherein the first organic composite insulation layer comprises a third edge extending along the first direction and a fourth edge extending along the second direction, and a minimum distance between an orthographic projection of the first edge on the base substrate and an orthographic projection of the third edge on the base substrate is greater than or equal to 40 μm and less than or equal to 200 um.

10. The display panel according to claim 1, further comprising: a drive structure layer located on the display region, a light emitting structure layer located on the drive structure layer, and a touch control structure layer located on the light emitting structure layer.

11. The display panel according to claim 10, wherein the drive structure layer comprises: a first insulation layer disposed on the base substrate, an active layer disposed on the first insulation layer, a second insulation layer covering the active layer, a first gate metal layer disposed on the second insulation layer, a third insulation layer covering the first gate metal layer, a second gate metal layer disposed on the third insulation layer, a fourth insulation layer covering the second gate metal layer, a first source-drain metal layer disposed on the fourth insulation layer, and a fifth insulation layer covering the first source-drain metal layer, the first gate metal layer at least comprises a gate electrode and a first capacitor electrode, the second gate metal layer at least comprises a second capacitor electrode, the first source-drain metal layer at least comprises a source electrode and a drain electrode, the first capacitor electrode and the second capacitor electrode constitute a storage capacitor, and the fifth insulation layer and the first inorganic insulation layer are located in a same layer and have a same material.

12. The display panel according to claim 11, wherein the multiple signal leads are located in the first gate metal layer and the second gate metal layer, respectively.

13. The display panel according to claim 12, wherein the multiple signal leads comprises multiple first leads and multiple second leads located on a side of the multiple first leads away from the base substrate, the multiple first leads and the multiple second leads are electrically connected, the third insulation layer is located between the multiple first leads and the multiple second leads, the multiple first leads are respectively located in the first gate metal layer, and the multiple second leads are respectively located in the second gate metal layer.

14. The display panel according to claim 11, wherein the multiple signal leads are respectively located in the first gate metal layer.

15. The display panel according to claim 11, wherein the multiple signal leads are respectively located in the second gate metal layer.

16. The display panel according to claim 11, further comprising: a first planarization layer disposed on the drive structure layer, a second source-drain metal layer disposed on the first planarization layer, a second planarization layer covering the second source-drain metal layer, a pixel definition layer disposed on the second planarization layer, the first organic composite insulation layer comprises a first organic insulation layer, a second organic insulation layer, and a third organic insulation layer disposed in sequence along a direction away from the base substrate, the first planarization layer and the first organic insulation layer are located in a same layer and have a same material, the second planarization layer and the second organic insulation layer are located in a same layer and have a same material, and the pixel definition layer and the third organic insulation layer are located in a same layer and have a same material.

17. The display panel according to claim 11, wherein the touch control structure layer comprises a bridge electrode layer, a seventh insulation layer, and a touch control electrode layer disposed in sequence on a side of the light emitting structure layer away from the base substrate, and the seventh insulation layer and the second inorganic insulation layer are located in a same layer and have a same material.

18. The display panel according to claim 1, wherein at least one first groove is disposed in the first organic composite insulation layer, and the at least one first groove is located between the display region and the bending region.

19. The display panel according to claim 1, wherein the bonding region further comprises a second fanout region, the second fanout region is located on a side of the bending region away from the display region, a second organic composite insulation layer is disposed on the second fanout region, at least one second groove is disposed in the second organic composite insulation layer, and the at least one second groove is located on a side of the bending region away from the display region.

20. The display panel according to claim 1, wherein the orthographic projection of the second inorganic insulation layer on the base substrate is not overlapped with the bending region.

* * * * *